(12) United States Patent
Howe

(10) Patent No.: US 11,275,650 B2
(45) Date of Patent: Mar. 15, 2022

(54) SYSTEMS AND METHODS FOR PERFORMING A WRITE PATTERN IN MEMORY DEVICES

(71) Applicant: Micron Technology, Inc., Boise, ID (US)

(72) Inventor: Gary L. Howe, Allen, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/038,251

(22) Filed: Sep. 30, 2020

(65) Prior Publication Data

US 2021/0011803 A1 Jan. 14, 2021

Related U.S. Application Data

(62) Division of application No. 15/812,949, filed on Nov. 14, 2017, now Pat. No. 10,824,503.

(51) Int. Cl.
| | |
|---|---|
| *G06F 11/00* | (2006.01) |
| *G06F 11/10* | (2006.01) |
| *G11C 11/4063* | (2006.01) |
| *G11C 11/4076* | (2006.01) |
| *G11C 29/52* | (2006.01) |
| *G11C 7/22* | (2006.01) |
| *G11C 7/10* | (2006.01) |
| *G11C 29/04* | (2006.01) |
| *G11C 8/12* | (2006.01) |

(52) U.S. Cl.
CPC ...... *G06F 11/1068* (2013.01); *G06F 11/1048* (2013.01); *G11C 11/4063* (2013.01); *G11C 11/4076* (2013.01); *G11C 7/1045* (2013.01); *G11C 7/222* (2013.01); *G11C 8/12* (2013.01); *G11C 29/52* (2013.01); *G11C 2029/0411* (2013.01)

(58) Field of Classification Search
None
See application file for complete search history.

(56) References Cited

U.S. PATENT DOCUMENTS

| | | | | |
|---|---|---|---|---|
| 6,289,413 | B1* | 9/2001 | Rogers | G06F 12/0893 711/105 |
| 2010/0020583 | A1* | 1/2010 | Kang | G11C 8/12 365/51 |
| 2012/0246392 | A1* | 9/2012 | Cheon | G06F 12/0638 711/103 |
| 2013/0332789 | A1* | 12/2013 | Troia | G06F 3/064 714/752 |
| 2014/0317471 | A1* | 10/2014 | Ryu | G06F 11/1048 714/764 |

(Continued)

*Primary Examiner* — Mujtaba M Chaudry
(74) *Attorney, Agent, or Firm* — Fletcher Yoder, P.C.

(57) ABSTRACT

A semiconductor device may include a memory bank and a plurality of mode registers that communicatively couple to each of the plurality of memory banks. The plurality of mode registers may include a pattern of data stored therein. The semiconductor device may also include a bank control that receives a write pattern command that causes the bank control to write the pattern of data into the memory bank, send a signal to a multiplexer to couple the plurality of mode registers to the memory bank, and write the pattern of data to the memory bank via the plurality of mode registers.

14 Claims, 2 Drawing Sheets

(56) References Cited

U.S. PATENT DOCUMENTS

| | | | |
|---|---|---|---|
| 2016/0078968 A1* | 3/2016 | Park | G11C 17/18 |
| | | | 365/96 |
| 2016/0092307 A1 | 3/2016 | Bonen et al. | |
| 2016/0155490 A1* | 6/2016 | Shin | G11C 11/4087 |
| | | | 365/203 |
| 2017/0132075 A1* | 5/2017 | Zastrow | G06F 11/1076 |
| 2017/0308433 A1 | 10/2017 | Kwon et al. | |
| 2018/0181344 A1* | 6/2018 | Tomishima | G11C 7/20 |
| 2018/0210787 A1 | 7/2018 | Bains et al. | |
| 2018/0217751 A1* | 8/2018 | Agarwal | G11C 16/3422 |

* cited by examiner

SYSTEMS AND METHODS FOR PERFORMING A WRITE PATTERN IN MEMORY DEVICES

CROSS-REFERENCE TO RELATED APPLICATION

This application is a Divisional of U.S. patent application Ser. No. 15/812,949, filed on Nov. 14, 2017, entitled "Systems and Methods for Performing a Write Pattern In Memory Devices," which is herein incorporated by reference.

BACKGROUND

Field of the Present Disclosure

Embodiments of the present disclosure relate generally to the field of semiconductor devices. More specifically, embodiments of the present disclosure relate to writing patterns of data into memory banks disposed on a memory die.

Description of Related Art

A semiconductor device, such as a microcomputer, memory, gate array, among others, may write data into memory banks based on data provided to the semiconductor device. That is, the semiconductor device may receive serial bursts of data to write into memory banks disposed within the semiconductor device. To increase the efficiency in which the semiconductor device writes the received data into the memory banks, the semiconductor device may incorporate certain circuit components to better facilitate different types of write operations. Embodiments described herein detail the design and architecture in which certain write operations may be performed within the semiconductor device.

DETAILED DESCRIPTION

Figure 1:
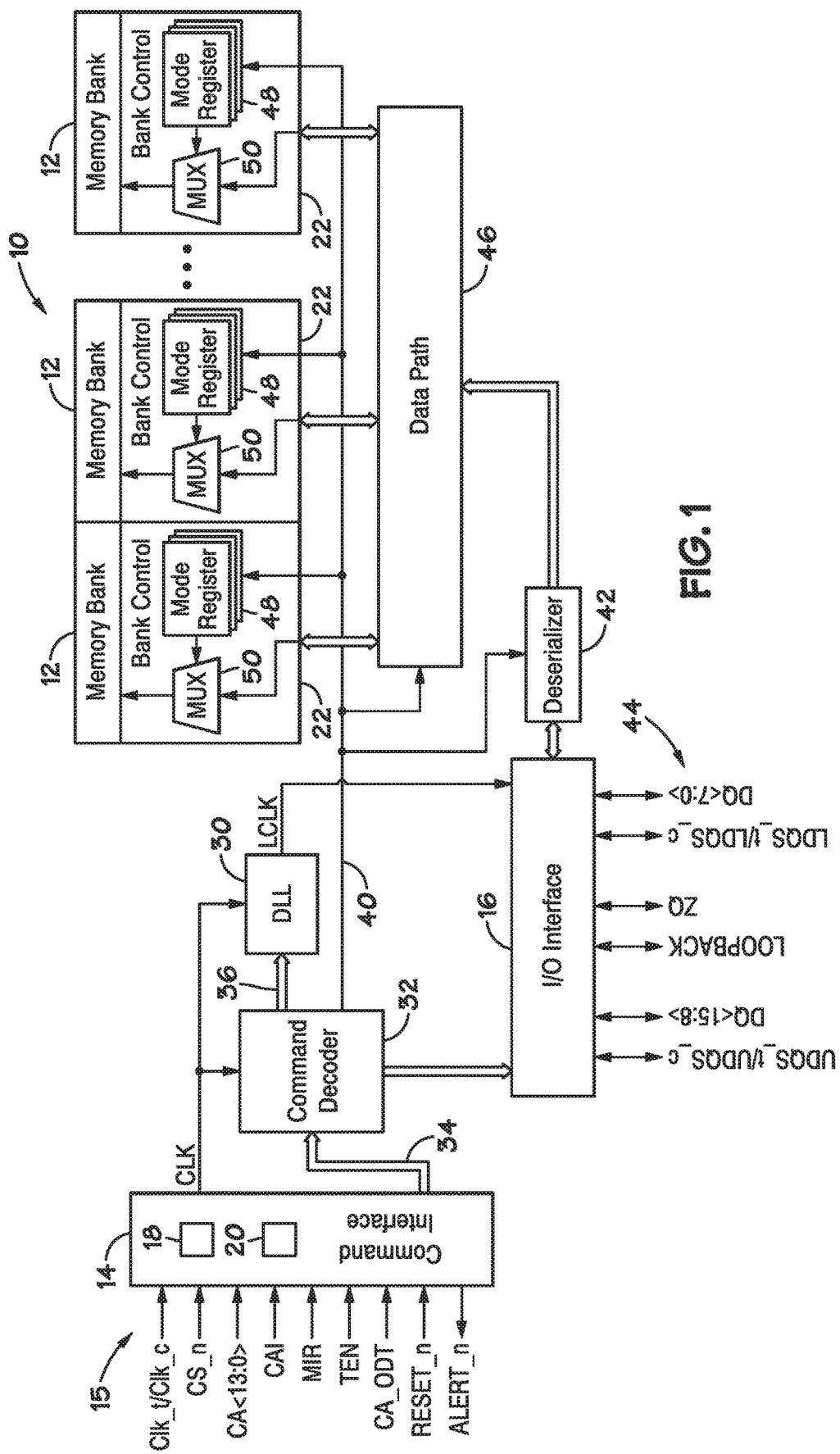
FIG. 1 is a simplified block diagram illustrating certain features of a memory device, according to an embodiment of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

During certain operations, patterns of data are written to memory banks of a semiconductor. In these types of operations (e.g., write pattern commands), the patterns of data may include writing up to 40% of the memory banks with zeros. With this in mind, instead of writing data (e.g., 0 or 1) to memory banks via bursts of data provided via each DQ input of an input/output (I/O) interface of a semiconductor device, a controller of the semiconductor device may employ mode registers of the semiconductor device to write these patterns of data. By using the mode registers to write patterns of data to the memory banks, the controller may avoid performing certain error checking operations multiple times.

For instance, when data is received via serial bursts (i.e., as opposed to writing data to the memory banks via the mode registers as described in the present disclosure), the controller may route the data to a specified memory bank, where a bank control may correct the incoming data with regard to errors present in the data. To write the same incoming data to other memory banks, the same process may be undertaken. That is, for each memory bank, the controller may receive the same incoming data and route the data to each memory bank. Each respective bank control may then, in turn, correct any errors in the incoming data and store the error-corrected data into the respective memory bank. By writing a pattern of data into different memory banks in this manner, the semiconductor device unnecessarily consumes power by repeatedly driving the data path from each input DQ to each respective memory bank and by repeatedly checking for errors in the incoming data at each individual bank control.

With the foregoing in mind, in certain embodiments of the present disclosure, mode registers may be placed within the semiconductor device, such that data patterns previously checked for errors and stored in the mode registers may be written to an associated memory bank without continuously accessing the data path from the input DQ to write the same pattern of data. Moreover, when the pre-determined data pattern is initially stored in the mode registers, the bank control may perform an error checking operation and include the parity bits in the mode register. As such, each subsequent time that the bank control writes the pre-determined data pattern into the memory bank, the bank control may write the data pattern to the memory via the mode register. Since the mode register includes the parity bits for the pre-determined data pattern, the bank control may avoid performing an error checking operation each time the pattern is written into the memory bank. Additional details with regard to the writing patterns of data in memory banks will be discussed below with reference to FIGS. 1-3.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a double data rate type five synchronous dynamic random access memory (DDR5 SDRAM) device. Various features of DDR5 SDRAM allow for reduced power consumption, more bandwidth and more storage capacity compared to prior generations of DDR SDRAM.

The memory device 10 may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMS). Each DIMM may include a number of SDRAM memory chips (e.g., x8 or x16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabit (Gb) DDR5 SDRAM, the memory chip may include 16 memory banks 12, arranged into 8 bank groups, each bank group including 2 memory banks. For a 16 Gb DDR5 SDRAM, the memory chip may include 32 memory banks 12, arranged into 8 bank groups, each bank group including 4 memory banks, for instance. Various other configurations, organization, and sizes of the memory banks 12 on the memory device 10 may be utilized depending on the application and design of the overall system.

The memory device 10 may include a command interface 14 and an input/output (I/O) interface 16. The command interface 14 is configured to provide a number of signals (e.g., signals 15) from an external device (not shown), such as a processor or controller. The processor or controller may provide various signals 15 to the memory device 10 to facilitate the transmission and receipt of data to be written to or read from the memory device 10.

As will be appreciated, the command interface 14 may include a number of circuits, such as a clock input circuit 18 and a command address input circuit 20, for instance, to ensure proper handling of the signals 15. The command interface 14 may receive one or more clock signals from an external device. Generally, double data rate (DDR) memory utilizes a differential pair of system clock signals, referred to herein as the true clock signal (Clk_t/) and the complementary clock signal (Clk_c). The positive clock edge for DDR refers to the point where the rising true clock signal Clk_t/ crosses the falling complementary clock signal Clk_c, while the negative clock edge indicates that transition of the falling true clock signal Clk_t and the rising of the complementary clock signal Clk_c. Commands (e.g., read command, write command, etc.) are typically entered on the positive edges of the clock signal and data is transmitted or received on both the positive and negative clock edges.

The clock input circuit 18 receives the true clock signal (Clk_t/) and the complementary clock signal (Clk_c) and generates an internal clock signal CLK. The internal clock signal CLK is supplied to an internal clock generator 30, such as a delay locked loop (DLL) circuit. The internal clock generator 30 generates a phase controlled internal clock signal LCLK based on the received internal clock signal CLK. The phase controlled internal clock signal LCLK is supplied to the I/O interface 16, for instance, and is used as a timing signal for determining an output timing of read data.

The internal clock signal CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the internal clock generator 30 over the bus 36 to coordinate generation of the phase controlled internal clock signal LCLK. The phase controlled internal clock signal LCLK may be used to clock data through the I/O interface 16, for instance.

Further, the command decoder 32 may decode commands, such as read commands, write commands, mode-register set commands, activate commands, etc., and provide access to a particular memory bank 12 corresponding to the command, via the bus path 40. As will be appreciated, the memory device 10 may include various other decoders, such as row decoders and column decoders, to facilitate access to the memory banks 12. In one embodiment, each memory bank 12 includes a bank control 22, which provides the necessary decoding (e.g., row decoder and column decoder), as well as other features, such as timing control and data control, to facilitate the execution of commands to and from the memory banks 12.

In addition, the memory device 10 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 14 using the clock signals (Clk_t/ and Clk_c). The command interface 14 may include a command address input circuit 20 which is configured to receive and transmit the commands to provide access to the memory banks 12, through the command decoder 32, for instance. In addition, the command interface 14 may receive a chip select signal (CS_n). The CS_n signal enables the memory device 10 to process commands on the incoming CA<13:0> bus. Access to specific banks 12 within the memory device 10 is encoded on the CA<13:0> bus with the commands.

In addition, the command interface 14 may be configured to receive a number of other command signals. For instance, a command/address on die termination (CA_ODT) signal may be provided to facilitate proper impedance matching within the memory device 10. A reset command (RESET_n) may be used to reset the command interface 14, status registers, state machines and the like, during power-up for instance. The command interface 14 may also receive a command/address invert (CAI) signal, which may be provided to invert the state of command/address signals CA<13:0> on the command/address bus, for instance, depending on the command/address routing for the particular memory device 10. A mirror (MIR) signal may also be provided to facilitate a mirror function. The MIR signal may be used to multiplex signals so that they can be swapped for enabling certain routing of signals to the memory device 10 based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data may be sent to and from the memory device 10, utilizing the command and clocking signals discussed above, by transmitting and receiving data signals 44 through the IO interface 16. More specifically, the data may be sent to or retrieved from the memory banks 12 over the data path 46, which includes a plurality of bi-directional data buses. Data IO signals, generally referred to as DQ signals, are generally transmitted and received in one or more bi-directional data busses. For certain memory devices, such as a DDR5 SDRAM memory device, the IO signals may be divided into upper and lower bytes. For instance, for a x16 memory device, the IO signals may be divided into upper and lower IO signals (e.g., DQ<15:8> and DQ<7:0>) corresponding to upper and lower bytes of the data signals, for instance.

To allow for higher data rates within the memory device 10, certain memory devices, such as DDR memory devices may utilize data strobe signals, generally referred to as DQS signals. The DQS signals are driven by the external processor or controller sending the data (e.g., for a write command) or by the memory device 10 (e.g., for a read command). For read commands, the DQS signals are effectively additional data output (DQ) signals with a predetermined pattern. For write commands, the DQS signals are used as clock signals to capture the corresponding input data. As with the clock signals (Clk_t/ and Clk_c), the data strobe (DQS) signals may be provided as a differential pair of data strobe signals (DQS_t/ and DQS_c) to provide differential pair signaling during reads and writes. For certain memory devices, such as a DDR5 SDRAM memory device, the differential pairs of DQS signals may be divided into upper and lower data strobe signals (e.g., UDQS_t/ and UDQS_c; LDQS_t/ and LDQS_c) corresponding to upper and lower bytes of data sent to and from the memory device 10, for instance.

An impedance (ZQ) calibration signal may also be provided to the memory device 10 through the IO interface 16. The ZQ calibration signal may be provided to a reference pin and used to tune output drivers and ODT values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. This resistor acts as a reference for adjusting internal ODT and drive strength of the IO pins.

In addition, a loopback signal (LOOPBACK) may be provided to the memory device 10 through the IO interface 16. The loopback signal may be used during a test or debugging phase to set the memory device 10 into a mode wherein signals are looped back through the memory device 10 through the same pin. For instance, the loopback signal may be used to set the memory device 10 to test the data output (DQ) of the memory device 10. Loopback may include both a data and a strobe or possibly just a data pin. This is generally intended to be used to monitor the data captured by the memory device 10 at the IO interface 16.

In certain embodiments, the I/O interface 16 may receive bursts of serial data via DQ inputs and may provide the serial data to a deserializer component 42. The deserializer component 42 may convert the serial data into parallel data. In one embodiment, the deserializer component 42 may convert the serial data for each DQ input as separate parallel data. The deserializer component 42 may feed each set of parallel data to the data path 46, which may provide the parallel data to the various memory banks 12. When the parallel data is to be written into the memory bank 12, a multiplexer (MUX) 50 receives the parallel data from the mode registers 48, as opposed to the data path 46.

In certain embodiments, each memory bank 12 may include a mode register 48 for each DQ input provided to the I/O interface 16. The mode registers 48, which may control an operational mode of various memory banks 12, may be coupled to each memory bank 12 an internal connection that may be controlled or operated by the bank control 22. As discussed above, in certain situations, a pattern of data may be written into the memory bank 12 a number of times. To avoid continuously performing an error correction operation on the same pattern of data and to avoid absorbing bandwidth and activity on the data path 46, the bank control 22 may use the mode registers 48 to write the pattern of data to the memory bank 12.

By way of example, the bank control 22 may initially receive data via the bus path 40 and store the data in the mode registers 48. When the bank control 22 initially receives the data, the bank control 22 may perform error checking operations (e.g., calculate error code correction (ECC) parity bits) on the received data. After generating the error-corrected data, the bank control 22 may store the error-corrected data in internal registers separate from the mode registers 48 for future write operations to the memory bank 12. After storing the error-corrected data in the internal registers, the bank control 22 may write the error-corrected data from the mode registers 48 to the memory bank 12 in response to receiving a write pattern command. Since the bank control 22 already corrected the data stored in the mode registers 48 for errors, each subsequent write pattern operation that writes the data already stored on the mode registers 48 may forego error correction operations.

As will be appreciated, various other components such as power supply circuits (for receiving external VDD and VSS signals), read/write amplifiers (to amplify signals during read/write operations), temperature sensors (for sensing temperatures of the memory device 10), etc., may also be incorporated into the memory device 10. Accordingly, it should be understood that the block diagram of FIG. 1 is only provided to highlight certain functional features of the memory device 10 to aid in the subsequent detailed description.

Figure 2:
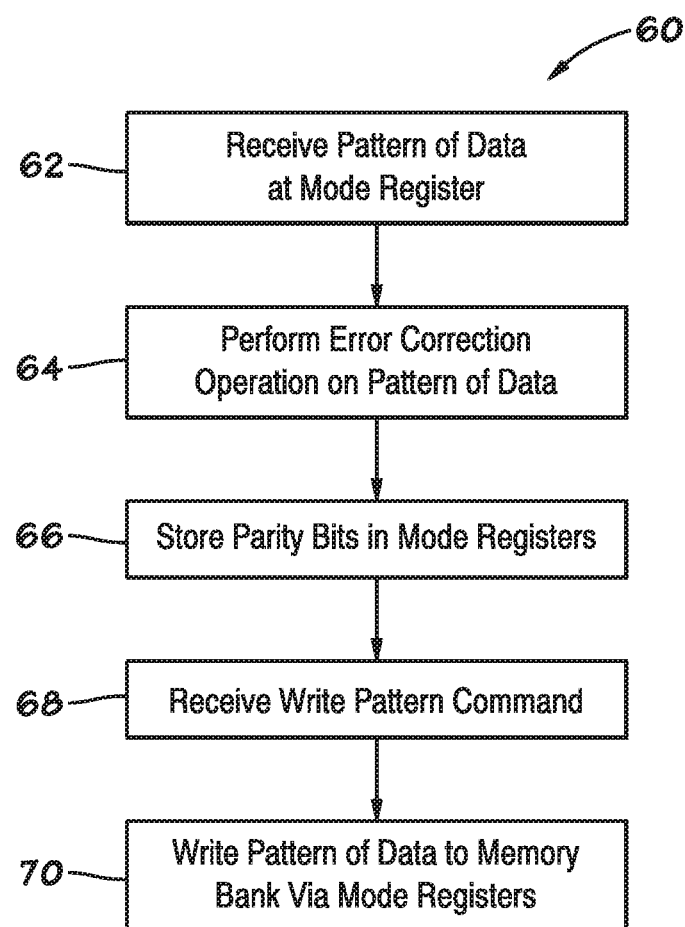
FIG. 2 illustrates a flow chart of a method for writing a pattern of data into memory banks within the memory device of FIG. 1, according to an embodiment of the present disclosure.

Keeping the foregoing in mind, FIG. 2 illustrates a flow chart of an example method 60 for performing a write pattern operation in the memory device 10. For the purposes of discussion, the following description of the method 60 will be described as being performed by the bank control 22 of one memory bank 12. However, it should be noted that any suitable control circuit, processor, system of chip (SoC), or the like may perform the method 60 described herein. In addition, although the following description of the method 60 is detailed in a particular order, it should be noted that the method 60 may be performed in any suitable order.

Referring now to FIG. 2, at block 62, the bank control 22 may receive a pattern of data to write into the mode registers 48 of a respective memory bank 12. If the pattern of data is replacing another pattern of data currently stored in the mode registers 48 or if the pattern of data is being provided to the mode registers 48 anew, the bank control 22 may perform an error correction operation to ensure that the pattern of data received via the data path 46 may be free of errors.

As such, at block 64, the bank control 22 may perform an error correction operation on the pattern of data stored in the mode registers 48. In one embodiment, the bank control 22 may determine parity bits for the pattern of data written into the mode registers 48. By way of example, if the I/O interface 16 include 16 input DQs, such that each input DQ may provide 8 bits of data, the bank control 22 may perform the error correction operation on the 128-bit pattern of data stored in the mode registers 48 and determine 8 parity bits as the error correction code for the stored pattern of data.

At block 66, the bank control 22 store the parity bits in internal registers separate from the mode registers 48. In one embodiment, when storing the parity bits in the internal registers, the bank control 22 may store the parity bits using latch circuits coupled to the bank control 22. As such, the latch circuit may store the parity bits in a static state, such that the parity bits remain saved for subsequent write operations to the memory bank 12 from the mode registers 48.

After the pattern of data and the parity bits are stored in the mode registers 48 and the internal registers, the bank control 22 may receive a write pattern command from the command interface 14 or the like. The write pattern command may indicate to the bank control 22 that pattern of data stored in the mode registers 48 are to be written into the respective memory bank 12 of the memory device 10. As such, the write pattern command, in some embodiments, may specify the particular memory bank 12 the pattern of data is written to. As such, the write pattern command may include an address component that specifies a particular memory bank 12 and may be transmitted via the bus path 40 to the respective bank control 22.

To write the pattern of data to the memory bank 12 at block 70, the bank control 22 may send a signal to the respective MUX 50 to receive data from the mode registers 48, as opposed to the data path 46. The bank control 22 may then write the pattern of data stored in the mode registers 48 using the parity bits stored in the latch circuit without performing an additional error checking operation. With the in mind, it should be noted, that any time that the bank control 22 receives the write pattern command and the pattern of data associated with the command is already stored in the mode registers 48, the bank control 22 may perform the write operations via the mode registers as described above with respect to blocks 68 and 70. As a result, the memory device 10 may reduce the use of the data path 46 for writing patterns of data and repeatedly performing error correction operations on data that is already stored in the mode registers 48 and have already been corrected.

Moreover, by having the mode registers 48 located within a close proximity to the memory banks 12, the memory device 10 may use less power in transmitting the parallel data from the mode registers 48 to the memory banks 12, as opposed to continuously transmitting the parallel data from the deserializer component 42 to each memory bank 12. That is, the closer that the mode registers 48 are located to the memory banks 12, less capacitive load may be present on the data path 46, thereby resulting in lower power consumption. In addition, since the parallel data is written to the memory banks 12 from the mode registers 48, which are internal to the memory device 10, the memory device 10 may consume less power in transmitting the parallel data to the memory banks 12, as compared to continuously receiving serial data via the DQ inputs and forwarding the serial data to each memory bank 12 when writing the same patterns of data multiple times.

It should be understood that when initially storing the pattern of data in the mode registers 48, the bank control 22 performs the error correction operation. By way of example, for a x8 write pattern, the memory device 10 may receive 16 bits of serial data from each of 8 DQ inputs of the I/O interface 16. Each 16-bit word received via a respective DQ input may be uniform with 16 zero values or 16 one values. After receiving each 16-bit word from a respective DQ input, the deserializer component 42 may generate parallel data, such that the 16-bit parallel data is stored in a respective mode register 48 via the data path 46. After the deserializer component 42 converts the serial data received from each DQ input into corresponding parallel data and stores the resulting parallel data in a respective mode register 48, the bank control 22 may perform an error correcting code (ECC) calculation on the received 128-bit parallel data and change or add one or more parity bits of the 128-bit parallel data stored in the corresponding memory bank 12, thereby generating error-corrected data. In certain embodiments, the bank control 22 may store the parity bits associated with the error-corrected data in the mode registers 48, using latches, or the like. In either case, the memory banks 12 may then receive the error-corrected data. The bank control 22 may then forego performing any ECC calculations when facilitating any subsequent request to write the pattern of data into the memory bank 12 via the mode registers 48. Instead, the bank control 22 may write the error-corrected data via the mode registers 48 and store the error-corrected data into the respective memory bank 12.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A semiconductor device, comprising:
   a plurality of memory banks;
   a plurality of mode registers configured to communicatively couple to each of the plurality of memory banks, wherein the plurality of mode registers comprise a pattern of data stored therein; and
   a bank control configured to:
   generate an error correction code from the pattern of data;
   store the error correction code associated with the pattern of data in the bank control;
   receive a write pattern command configured to cause the bank control to write the pattern of data into a memory bank of the plurality of memory banks;
   send a signal to a multiplexer to couple the plurality of mode registers to the memory bank of the plurality of memory banks; and
   write an error-corrected pattern of data to the memory bank of the plurality of memory banks via the plurality of mode registers, utilizing the stored error correction code.

2. The semiconductor device of claim 1, wherein the multiplexer is configured to communicatively couple the plurality of mode registers or couple one or more DQ inputs to the memory bank.

3. The semiconductor device of claim 1, wherein the bank control is configured to:
   receive the pattern of data prior to receiving the write pattern command;
   generate the error correction code based on the pattern of data; and
   write the error-corrected pattern of data from the plurality of mode registers.

4. The semiconductor device of claim 1, wherein the error correction code comprises one or more parity bits.

5. The semiconductor device of claim 1, comprising a latch circuit coupled to the plurality of mode registers, wherein the bank control is configured to store error correction code in the latch circuit.

6. The semiconductor device of claim 1, comprising internal registers coupled to the plurality of mode registers, wherein the bank control is configured to store error correction code in the internal registers.

7. The semiconductor device of claim 1, wherein the bank control is configured to store error correction code in the internal registers.

8. The semiconductor device of claim 1, wherein the bank control is configured to:
   receive the pattern of data as a plurality of sets of parallel data prior to receiving the write pattern command; and
   generate the error-corrected pattern of data based on the plurality of sets of parallel data.

9. The semiconductor device of claim 8, comprising a deserializer component configured to provide the pattern of data as the plurality of sets of parallel data.

10. The semiconductor device of claim 8, wherein each respective set of the plurality of sets of parallel data is written into a respective one of the plurality of mode registers.

11. The semiconductor device of claim 8, wherein each respective set of the plurality of sets comprises either a plurality of zero values or a plurality of one values.

12. The semiconductor device of claim 1, comprising a deserializer component configured to:
    receive the pattern of data as serial data to be written into the plurality of mode registers;
    convert the serial data into a parallel dataset; and
    transmit a respective portion of the parallel dataset to a respective one of the plurality of mode registers.

13. The semiconductor device of claim 1, wherein the write pattern command is configured to cause the bank control to write the pattern of data into the memory bank a plurality of times.

14. The semiconductor device of claim 1, wherein the number of mode registers of the plurality of mode registers is equal to a number of DQ inputs received via an input/output interface of the semiconductor device.

* * * * *